(12) United States Patent
Lin

(10) Patent No.: US 10,777,564 B2
(45) Date of Patent: Sep. 15, 2020

(54) NON-VOLATILE MEMORY DEVICE

(71) Applicant: Copee Technology Company, Hsinchu (TW)

(72) Inventor: Yuan-Hsuan Lin, Hsinchu (TW)

(73) Assignee: Copee Technology Company, Hsinchu (TW)

( * ) Notice: Subject to any disclaimer, the term of this patent is extended or adjusted under 35 U.S.C. 154(b) by 0 days.

(21) Appl. No.: 16/400,013

(22) Filed: Apr. 30, 2019

(65) Prior Publication Data

US 2019/0386016 A1 Dec. 19, 2019

(30) Foreign Application Priority Data

Jun. 15, 2018 (TW) .............................. 107120830 A

(51) Int. Cl.
*G11C 16/04* (2006.01)
*H01L 27/11517* (2017.01)
*G11C 16/26* (2006.01)
*G11C 16/14* (2006.01)

(52) U.S. Cl.
CPC .... *H01L 27/11517* (2013.01); *G11C 16/0408* (2013.01); *G11C 16/14* (2013.01); *G11C 16/26* (2013.01)

(58) Field of Classification Search
CPC ...... G11C 16/0408; G11C 16/14; G11C 16/26
See application file for complete search history.

(56) References Cited

U.S. PATENT DOCUMENTS

| 6,704,222 B2 * | 3/2004 | Guterman | .......... | G11C 16/0425 |
| | | | | 257/E21.682 |
| 9,042,174 B2 * | 5/2015 | Ching | ................ | G11C 16/0441 |
| | | | | 365/185.15 |
| 9,633,735 B2 * | 4/2017 | Kim | ........................ | G11C 16/14 |
| 2013/0223148 A1 * | 8/2013 | Seo | ......................... | H01L 27/04 |
| | | | | 365/185.11 |

* cited by examiner

*Primary Examiner* — Pho M Luu
(74) *Attorney, Agent, or Firm* — CKC & Partners Co., Ltd.

(57) ABSTRACT

A non-volatile memory device that includes a floating gate element, a control coupling element, an erase coupling element and a select gate element is provided. The floating gate element includes a floating gate layer. The control coupling element receives a control voltage and couples the control voltage to the floating gate layer such that the floating gate element performs read or write operation according to the control voltage, a word select voltage and a bit select voltage. The erase coupling element receives an erase voltage and couples the erase voltage to the floating gate layer such that the floating gate element performs erase operation according to the erase voltage. The select gate element is electrically coupled to the floating gate element and generates the word select voltage according to a word line driving voltage and a source line driving voltage.

7 Claims, 2 Drawing Sheets

NON-VOLATILE MEMORY DEVICE

RELATED APPLICATIONS

This application claims priority to Taiwan Application Serial Number 107120830, filed Jun. 15, 2018, which is herein incorporated by reference.

BACKGROUND

Field of Invention

The present invention relates to a memory technology. More particularly, the present invention relates to a non-volatile memory device.

Description of Related Art

In recent years, most integrated circuit chip systems are implemented by using system-on-a-chip (SoC) technology such that the memory has to be integrated with the system into a single chip. Along with scale-down of the manufacturing process, the thickness of the gate oxide is shrunk, and the read operation and the write operation of conventional non-volatile memory devices are performed by using a single transistor. As a result, a thin oxide layer is easy to be damaged since the voltage is required to be applied to the same element for both of the read operation and write operation. The reliability of the element is therefore decreased.

Accordingly, what is needed is a non-volatile memory device to address the issues mentioned above.

SUMMARY

An aspect of the present invention is to provide a non-volatile memory device that includes a floating gate element, a control coupling element, an erase coupling element and a select gate element. The floating gate element includes a floating gate layer. The control coupling element is configured to receive a control voltage and couple the control voltage to the floating gate layer such that the floating gate element performs read operation or write operation according to the control voltage, a word select voltage and a bit select voltage. The erase coupling element is configured to receive an erase voltage and to couple the erase voltage to the floating gate layer such that the floating gate element performs erase operation according to the erase voltage. The select gate element is electrically coupled to the floating gate element and is configured to generate the word select voltage according to a word line driving voltage and a source line driving voltage.

Another aspect of the present invention is to provide a non-volatile memory device that includes a floating gate element, a control coupling element, an erase coupling element and a select gate element. The floating gate element includes a gate oxide layer and a floating gate layer. The control coupling element includes a first well region, a first doping area within the first well region and the first oxide layer, wherein the floating gate layer extends to cover the first oxide layer and the control coupling element receives a control voltage through the first doping area to couple the control voltage to the floating gate layer through the first well region and the first oxide layer such that the floating gate element performs read operation or write operation according to the control voltage, a word select voltage and a bit select voltage. The erase coupling element includes a second well region, a second doping area within the second well region and a second oxide layer, wherein floating gate layer extends to cover the second oxide layer and the erase coupling element receives an erase voltage through the second doping area to couple the erase voltage to the floating gate layer through the second well region and the second oxide layer such that the floating gate element performs erase operation according to the erase voltage. The select gate element is electrically coupled to the floating gate element and configured to generate the word select voltage according to a word line driving voltage and a source line driving voltage.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
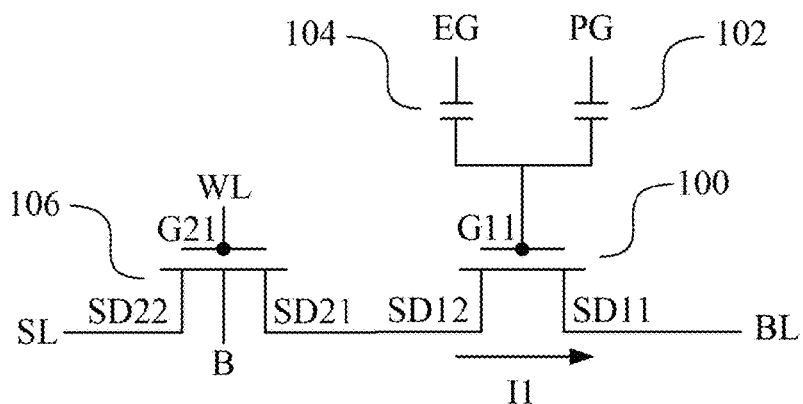
FIG. 1A is a circuit diagram of a non-volatile memory device in an embodiment of the present invention.
Figure 1B:
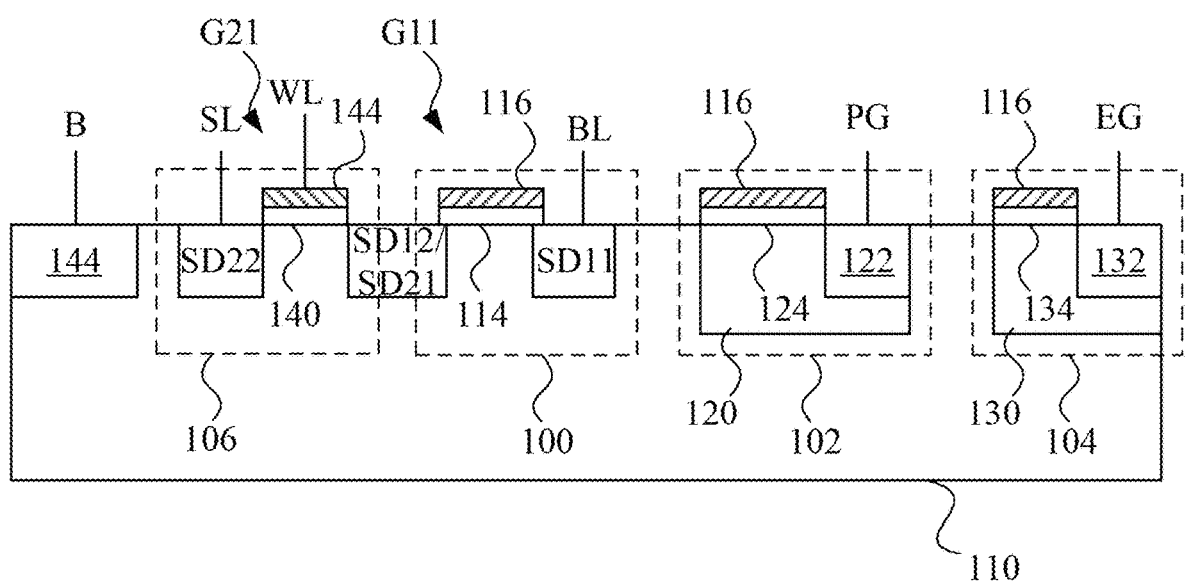
FIG. 1B is a diagram of a cross-sectional view of the non-volatile memory device in FIG. 1A in an embodiment of the present invention.
Figure 1C:
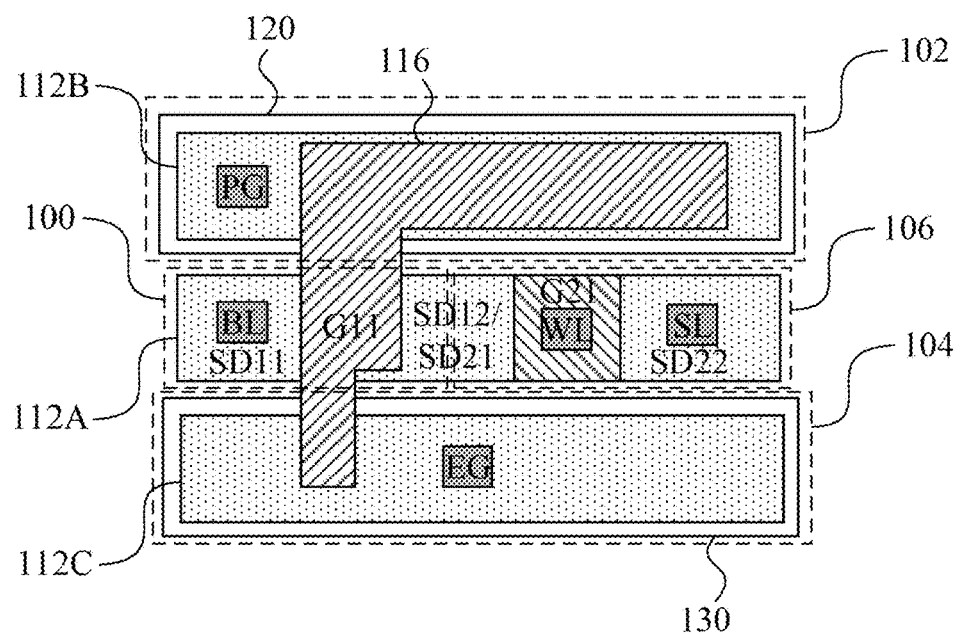
FIG. 1C is a layout diagram of the non-volatile memory device in FIG. 1A in an embodiment of the present invention.

Reference is made to FIG. 1A, FIG. 1B and FIG. 1C at the same time. FIG. 1A is a circuit diagram of a non-volatile memory device 1 in an embodiment of the present invention. FIG. 1B is a diagram of a cross-sectional view of the non-volatile memory device 1 in FIG. 1A in an embodiment of the present invention. FIG. 1C is a layout diagram of the non-volatile memory device 1 in FIG. 1A in an embodiment of the present invention.

In an embodiment, the non-volatile memory device 1 is formed on a substrate 110 illustrated in FIG. 1B. The non-volatile memory device 1 includes a floating gate element 100, a control coupling element 102, an erase coupling element 104 and a select gate element 106.

In FIG. 1B and FIG. 1C, the floating gate element 100 is surrounded by a dash-line frame labeled as 100. The floating gate element 100 includes a gate G11, a source/drain SD11 and a source/drain SD12.

The source/drain SD11 and the source/drain SD12 are formed in an active area 112A illustrated as a dotted block. In an embodiment, the substrate 110 is a p-type substrate. The source/drain SD11 and the source/drain SD12 are respectively an n-type doping area. In an embodiment, the source/drain SD11 is electrically coupled to the bit line BL.

The gate G11 includes a gate oxide layer 114 and a floating oxide layer 116. The floating oxide layer 116 covers the gate oxide layer 114 and is illustrated as a block having slashes in FIG. 1B and FIG. 1C. In an embodiment, the material of the floating oxide layer 116 is such as, but not limited to poly-silicon, metal or polycide.

In FIG. 1B and FIG. 1C, the control coupling element 102 is surrounded by a dash-line frame labeled as 102. The control coupling element 102 includes a well region 120, a doping area 122 in the well region 120 and an oxide layer 124.

The well region 120 includes an active area 112B illustrated as a dotted block. The doping area 122 is formed in the active area 112B, and the oxide layer 124 on the active area 112B neighboring to the doping area 122. In an embodiment, the well region 120 and the doping area 122 are an n-type well region and an n-type doping area respectively. Further, in an embodiment, the doping area 122 is electrically coupled to a control line PG.

In FIG. 1B and FIG. 1C, the erase coupling element 104 is surrounded by a dash-line frame labeled as 104. The erase coupling element 104 includes a well region 130, a doping area 132 in the well region 130 and an oxide layer 134.

The well region 130 includes an active area 112C illustrated as a dotted block. The doping area 132 is formed in the active area 112C, and the oxide layer 134 is formed on the active area 112C neighboring to the doping area 132. In an embodiment, the well region 130 and the doping area 132 are an n-type well region and an n-type doping area respectively. Further, in an embodiment, the doping area 132 is electrically coupled to an erase line EG.

In an embodiment, the floating oxide layer 116 in FIG. 1B is illustrated as separate parts on the gate oxide layer 114, the oxide layer 124 and the oxide layer 134 in order not to be confused with other elements. Actually, as illustrated in FIG. 1C, the floating oxide layer 116 extends from the gate oxide layer 114 to cover the oxide layer 124 and the oxide layer 134.

In FIG. 1B and FIG. 1C, the select gate element 106 is surrounded by a dash-line frame labeled as 106. The select gate element 106 includes a select gate G21, a source/drain SD21 and a source/drain SD22.

The source/drain SD21 and the source/drain SD22 are formed in the active area 112A. In an embodiment, the source/drain SD21 and the source/drain SD22 are respectively an n-type doping area. The source/drain SD21 is actually shared with the source/drain SD12. In an embodiment, the source/drain SD22 is electrically coupled to a source line SL.

The select gate G21 includes a gate oxide layer 140 and a select gate layer 142. The select gate layer 142 covers the gate oxide layer 140 and is illustrated as a block having backslashes. In an embodiment, the material of the select gate layer 142 is such as, but not limited to poly-silicon, metal or polycide. In an embodiment, the select gate layer 142 is electrically coupled to the word line WL.

In an embodiment, the select gate element 106 further includes a base area 144 electrically coupled to a base voltage B.

It is appreciated that in FIG. 1A and FIG. 1B, the physical structures of the signal lines described above are not illustrated. Only the nodes labeled as BL, PG, EG, WL and SL are illustrated, in which the nodes are the circuit nodes electrically coupled to the signal lines described above. In FIG. 1C, the physical structures of the signal lines described above are not illustrated either. Only the gray-scale patterns labeled as BL, PG, EG, WL and SL are illustrated, in which the gray-scale patterns are the contacts electrically coupled to the signal lines described above in the layout diagram.

Further, in FIG. 1C, the floating gate element 100 and the select gate element 106 are illustrated as being arranged in a direction while the control coupling element 102 and the erase coupling element 104 are illustrated as being parallel with the floating gate element 100 and the select gate element 106. However, in FIG. 1B, for convenience of describing how the floating gate element 100, the select gate element 106, the control coupling element 102 and the erase coupling element 104 are disposed on the substrate 110, the floating gate element 100, the select gate element 106, the control coupling element 102 and the erase coupling element 104 are illustrated along with a same direction. In the actual fabrication process of the non-volatile memory device 1, the arrangement of FIG. 1B or the arrangement of FIG. 1C can be used selectively.

In operation, when the select gate G21 of the select gate element 106 receives a word line driving voltage from the word line WL and the source/drain SD22 receives a source line driving voltage from the source line SL, the select gate G21 generates the word select voltage to the source/drain SD21.

In an embodiment, the word line driving voltage drives the select gate element 106 to be conducted such that the source line driving voltage can be transmitted from the source/drain SD22 to the source/drain SD21 to output the word select voltage. Further, the word line driving voltage can be such as, but not limited to 2 volts. The source line driving voltage and the word select voltage respectively can be such as, but not limited to 0 volt.

In an embodiment, the control coupling element 102 is configured to receive a control voltage from the control line PG through the doping area 122 and couple the control voltage to the floating oxide layer 116 through the well region 120. At the same time, the source/drain SD12 of the floating gate element 100 receives the word select voltage from the source/drain SD21 and receives the bit select voltage from the source/drain SD11 to perform write operation according to the control voltage, the word select voltage and the bit select voltage to determine an electrical status of the floating gate element 116.

In an embodiment, the control voltage that controls the floating gate element 100 to perform write operation can be 18 volts. The bit select voltage received from the bit line BL can be 0 volt.

In an embodiment, the control coupling element 102 is configured to receive a control voltage from the control line PG through the doping area 122 and couple the control voltage to the floating oxide layer 116 through the well region 120. At the same time, the source/drain SD12 of the floating gate element 100 receives the word select voltage from the source/drain SD21 and receives the bit select voltage from the source/drain SD11 to perform read operation according to the control voltage, the word select voltage, the bit select voltage and the electrical status of the floating gate element 116 to generate a read current I1.

In an embodiment, the control voltage that controls the floating gate element 100 to perform read operation is 2 volts. The bit select voltage received from the bit line BL can be 2 volt.

As a result, in an embodiment, when the floating oxide layer 116 is at an initial status that stores no electric charge, and when the floating gate element 100 perform write operation according to a high state of the control voltage, the electric charges are stored in the floating oxide layer 116. When the floating oxide layer 116 is at the initial status that stores no electric charge, and when the floating gate element 100 perform write operation according to a low state of the control voltage, no electric charge is stored in the floating oxide layer 116. Therefore, one the status that has the electric charges stored and the status that has no electric charge stored corresponds to a high state data, and the other one of the two status corresponds to a low state data.

On the other hand, when the floating gate element 100 generates the read current I1 according to the control voltage, the word select voltage, the bit select voltage and the electrical status of the gate G11, an external circuit (not illustrated) can be used to determine the electrical status of the floating gate element 116 according to the value of the read current I1 to further determine the stored data content.

In an embodiment, the erase coupling element 104 is configured to receive an erase voltage from the erase line EG through the doping area 132 and couple the erase voltage to the floating oxide layer 116 through the well region 130. The floating gate element 100 erase the electrical status of the floating gate element 116 according to the erase voltage such that the electrical status returns to the initial status that stores no electric charge described above. In an embodiment, the erase voltage that controls the floating gate element 100 to perform erase operation can be 15 volts.

Figure 2:
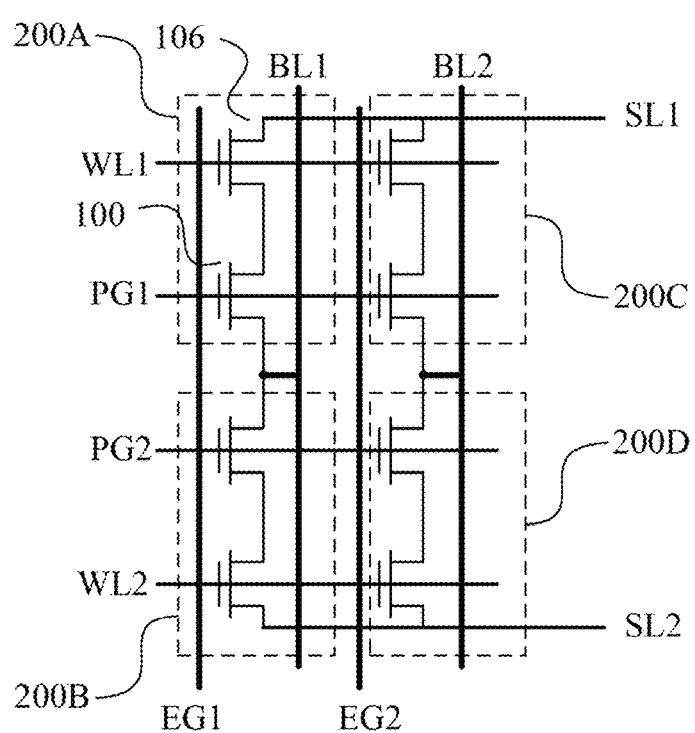
FIG. 2 is a circuit diagram of the memory array in an embodiment of the present invention.

Reference is now made to FIG. 2. FIG. 2 is a circuit diagram of the memory array 2 in an embodiment of the present invention.

The memory array 2 includes four non-volatile memory devices 200A, 200B, 200C and 200D arranged in two rows and two columns. Each of the non-volatile memory devices 200A, 200B, 200C and 200D is equivalent to the non-volatile memory device 1 illustrated in FIG. 1. However, for convenience to make the drawing clear, take the non-volatile memory device 200A as an example, only the floating gate element 100 and the select gate element 106 are illustrated in FIG. 2. Actually, the non-volatile memory device 200A also includes the control coupling element 102 and the erase coupling element 104 illustrated in FIG. 1 and the non-volatile memory device 200A is electrically coupled to the control line PG1 and the erase line EG1 respectively through the control coupling element 102 and the erase coupling element 104.

In the present embodiment, the non-volatile memory devices 200A and 200C share the same control line PG1, the word line WL1 and the source line SL1. The non-volatile memory devices 200B and 200D share the same control line PG2, the word line WL2 and the source line SL2. The non-volatile memory devices 200A and 200B share the same erase line EG1 and the bit line BL1. The non-volatile memory devices 200C and 200D share the same erase line EG2 and the bit line BL2.

Reference is now made to Table 1. Table 1 includes examples of voltage values of each of the signal lines during the performance of read operation, write operation and erase operation in an embodiment of the present invention. When a multiple of non-volatile memory devices form the memory array, e.g. the memory array 2 illustrated in FIG. 2, S represents the non-volatile memory device that is selected to perform the corresponding operation, and US represents the non-volatile memory device that is not selected to perform any operation.

TABLE 1

| | PG | | WL | | BL | |
|---|---|---|---|---|---|---|
| | S | US | S | US | S | US |
| Read | 2 | 0 | 2 | 0 | 2 | 0 |
| Write | 18 | 0 | 0 | 0 | 0 | 6 |
| Erase | 0 | 0 | 0 | 0 | 0 | 0 |

TABLE 1-continued

| | SL | | EG | |
|---|---|---|---|---|
| | S | US | S | US |
| Read | 0 | 0 | 0 | 0 |
| Write | 0 | 0 | 6 | 6 |
| Erase | 0 | 0 | 15 | 0 |

It is appreciated that during the write operation, the erase coupling element 104 of the selected non-volatile memory device can receive an inhibit voltage from the erase line EG through the doping area 132 (e.g. 6 volts illustrated in Table 1) to avoid the floating oxide layer 116 injects electronic charges through the well region 130.

Besides, during the write operation, besides the inhibit voltage received by the erase coupling element 104, the floating gate element 100 of the selected non-volatile memory device is required to receive the inhibit voltage from the bit line BL to lower the voltage difference between the floating oxide layer 116 and the gate oxide layer 114 to avoid the electric charges being drawn to the floating oxide layer 116.

In some technologies, the read operation and the write operation of the memory use a single element, such as, but not limited to a transistor. Since the voltage is applied to the same element in both of the read operation and the write operation, the oxide layer is easy to be damaged to further decrease the reliability of the element. In the non-volatile memory device 1 in the present invention, the read and the write operation of the floating gate element 100 is performed by the control coupling element 102 and the erase operation of the floating gate element 100 is performed by the erase coupling element 104. The control voltage and the erase voltage are coupled through the well regions 120 and 130 respectively such that the operations are performed by using the oxide layers 124 and 134 independently. The damage of the gate oxide layer 114 of the floating gate element 100 can be decreased to increase the reliability of the element.

Further, in an embodiment, as illustrated in FIG. 1C, a first area of the gate oxide layer 114 covered by the floating oxide layer 116 is smaller than a second area of the control coupling element 102 covered by the floating oxide layer 116. A third area of the oxide layer 134 covered by the floating oxide layer 116 is smaller than the first area of the gate oxide layer 114 covered by the floating oxide layer 116.

Making the second area of the control coupling element 102 covered by the floating oxide layer 116 having a larger area provides a stronger coupling ability. The well region 120 of the control coupling element 102 provides the control voltage used to perform the read operation and the write operation more efficiently. Especially, the electrons can be drawn to the floating oxide layer 116 more efficiently during the write operation.

On the other hand, making the third area of the oxide layer 134 covered by the floating oxide layer 116 having a smaller area decreases the coupling ability thereof. The voltage difference between the floating oxide layer 116 and the erase coupling element 104 is thus increased to obtain a more efficient erasing result.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A non-volatile memory device comprising:
   a floating gate element comprising a gate oxide layer and a floating gate layer;
   a control coupling element comprising a first well region, a first doping area within the first well region and a first oxide layer, wherein the floating gate layer extends to cover the first oxide layer and the control coupling element receives a control voltage through the first doping area to couple the control voltage to the floating gate layer through the first well region and the first oxide layer such that the floating gate element performs read operation or write operation according to the control voltage, a word select voltage and a bit select voltage;
   an erase coupling element comprising a second well region, a second doping area within the second well region and a second oxide layer, wherein floating gate layer extends to cover the second oxide layer and the erase coupling element receives an erase voltage through the second doping area to couple the erase voltage to the floating gate layer through the second well region and the second oxide layer such that the floating gate element performs erase operation according to the erase voltage; and
   a select gate element electrically coupled to the floating gate element and configured to generate the word select voltage according to a word line driving voltage and a source line driving voltage.

2. The non-volatile memory device of claim 1, wherein the floating gate element further comprises a first source/drain and a second source/drain, the floating gate element is configured to receive the bit select voltage through the first source/drain and receive the word select voltage through the second source/drain.

3. The non-volatile memory device of claim 2, wherein the floating gate element performs read operation according to the control voltage, the word select voltage, the bit select voltage and an electrical status of the floating gate element to generate a read current.

4. The non-volatile memory device of claim 2, wherein the select gate element comprises a third source/drain electrically coupled to the second source/drain, a fourth source/drain and a select gate, and the select gate element is configured to generate the word select voltage when the select gate receives the word line driving voltage and when the fourth source/drain receives the source line driving voltage.

5. The non-volatile memory device of claim 3, wherein the first source/drain is electrically coupled to a bit line, the select gate is electrically coupled to a word line, the fourth source/drain is electrically coupled to a source line, the first doping area is electrically coupled to a control line and the second doping area is electrically coupled to an erase line.

6. The non-volatile memory device of claim 1, wherein the floating gate element performs write operation according to the control voltage, the word select voltage and the bit select voltage to determine an electrical status of the floating gate element.

7. The non-volatile memory device of claim 1, wherein a first area of the gate oxide layer covered by the floating gate layer is smaller than a second area of the first oxide layer covered by the floating gate layer, and a third area of the second oxide layer covered by the floating gate layer is smaller than the first area.

* * * * *